United States Patent
Stiffler et al.

(10) Patent No.: US 9,923,334 B2
(45) Date of Patent: Mar. 20, 2018

(54) LASER DIODE DRIVER WITH VARIABLE INPUT VOLTAGE AND VARIABLE DIODE STRING VOLTAGE

(71) Applicant: Raytheon Company, Waltham, MA (US)

(72) Inventors: Robert F. Stiffler, Lakewood, CA (US); Joe A. Ortiz, Garden Grove, CA (US); Philip C. Todd, Los Alamitos, CA (US); James Lazar, Moorpark, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/408,599

(22) Filed: Jan. 18, 2017

(65) Prior Publication Data

US 2017/0163007 A1    Jun. 8, 2017

Related U.S. Application Data

(63) Continuation of application No. 14/960,515, filed on Dec. 7, 2015, now Pat. No. 9,601,904.

(51) Int. Cl.
| | |
|---|---|
| *H01S 5/042* | (2006.01) |
| *H02M 1/088* | (2006.01) |
| *H02M 1/14* | (2006.01) |
| *H02M 1/34* | (2007.01) |
| *H02M 3/10* | (2006.01) |

(Continued)

(52) U.S. Cl.
CPC ............ *H01S 5/042* (2013.01); *H02M 1/088* (2013.01); *H02M 1/14* (2013.01); *H02M 1/34* (2013.01); *H02M 3/10* (2013.01); *H01S 3/0941* (2013.01); *H01S 5/06825* (2013.01); *H01S 5/4025* (2013.01); *H02M 3/337* (2013.01); *H02M 2001/007* (2013.01);

(Continued)

(58) Field of Classification Search
CPC .... H01S 5/042; H01S 5/06825; H01S 3/0941; H01S 5/4025; H02M 1/088; H02M 3/10; H02M 1/34; H02M 1/14; H02M 2001/0054; H02M 2001/007; H02M 2001/0058; H02M 3/337; H02M 2003/1586

See application file for complete search history.

(56) References Cited

U.S. PATENT DOCUMENTS

| | | |
|---|---|---|
| 3,967,213 A | 6/1976 | Yariv |
| 4,662,727 A | 5/1987 | Griffin |

(Continued)

*Primary Examiner* — Xinning Niu
(74) *Attorney, Agent, or Firm* — Cantor Colburn LLP

(57) ABSTRACT

A high-power laser system includes a plurality of cascaded diode drivers, a pump source, and a laser element. The diode drivers are configured to generate a continuous driver signal. The pump source is configured to generate radiated energy in response to the continuous driver signal. The laser element is disposed downstream from the pump source and is configured to generate a laser beam in response to stimulation via the radiated energy. The high-power laser system further includes an electronic controller configured to output at least one driver signal that operates the plurality of diode drivers at a fixed frequency. The at least one driver signal operates a first cascade diode driver among the plurality of diode drivers 90 degrees out of phase with respect to a second cascade diode driver among the plurality of diode drivers.

11 Claims, 4 Drawing Sheets

(51) Int. Cl.
　　 *H01S 5/40* 　　　　(2006.01)
　　 *H02M 3/158* 　　　(2006.01)
　　 *H01S 3/0941* 　　 (2006.01)
　　 *H01S 5/068* 　　　(2006.01)
　　 *H02M 3/337* 　　 (2006.01)
　　 *H02M 1/00* 　　　 (2006.01)

(52) U.S. Cl.
　　 CPC ............... *H02M 2001/0054* (2013.01); *H02M 2001/0058* (2013.01); *H02M 2003/1586* (2013.01)

(56) References Cited

U.S. PATENT DOCUMENTS

| | | |
|---|---|---|
| 4,791,648 A | 12/1988 | Vokaj et al. |
| 5,048,044 A | 9/1991 | Ireland |
| 5,062,117 A | 10/1991 | Anthon |
| 5,228,051 A | 7/1993 | Matthews |
| 5,287,372 A | 2/1994 | Ortiz |
| 5,363,391 A | 11/1994 | Matthews et al. |
| 5,441,803 A | 8/1995 | Meissner |
| 5,546,416 A | 8/1996 | Basu |
| 5,608,745 A | 3/1997 | Hall et al. |
| 5,625,499 A | 4/1997 | Chen |
| 5,636,239 A | 6/1997 | Bruesselbach et al. |
| 5,652,681 A | 7/1997 | Chen et al. |
| 5,736,881 A | 4/1998 | Ortiz |
| 5,846,638 A | 12/1998 | Meissner |
| 5,852,622 A | 12/1998 | Meissner et al. |
| 5,949,805 A | 9/1999 | Mordaunt et al. |
| 5,991,319 A | 11/1999 | Zamel et al. |
| 6,014,391 A | 1/2000 | Byren |
| 6,025,060 A | 2/2000 | Meissner et al. |
| 6,160,824 A | 12/2000 | Meissner et al. |
| 6,178,040 B1 | 1/2001 | Injeyan et al. |
| 6,219,360 B1 | 4/2001 | Komine |
| 6,229,939 B1 | 5/2001 | Komine |
| 6,243,515 B1 | 6/2001 | Heflinger et al. |
| 6,268,956 B1 | 7/2001 | Injeyan et al. |
| 6,288,381 B1 | 9/2001 | Messina |
| 6,349,044 B1 * | 2/2002 | Canales-Abarca ..... H02M 1/34 363/134 |
| 6,404,784 B2 | 6/2002 | Komine |
| 6,462,891 B1 | 10/2002 | Fukumoto et al. |
| 6,480,272 B1 | 11/2002 | Rock |
| 6,587,488 B1 | 7/2003 | Meissner et al. |
| 6,639,682 B2 | 10/2003 | Neily et al. |
| 6,646,793 B2 | 11/2003 | Bruesselbach et al. |
| 6,667,999 B2 | 12/2003 | Hasson et al. |
| 6,678,294 B1 | 1/2004 | Komine et al. |
| 6,690,696 B2 | 2/2004 | Byren et al. |
| 6,738,396 B2 | 5/2004 | Filgas et al. |
| 6,768,751 B2 | 7/2004 | Hoar |
| 6,785,304 B2 | 8/2004 | Filgas |
| 6,792,028 B2 | 9/2004 | Cook et al. |
| 6,809,307 B2 | 10/2004 | Byren et al. |
| 6,822,994 B2 | 11/2004 | Kennedy |
| 6,859,472 B2 | 2/2005 | Betin et al. |
| 6,914,928 B2 | 7/2005 | Trussel, Jr. |
| 6,967,766 B2 | 11/2005 | Reeder et al. |
| 7,019,503 B1 | 3/2006 | Ortiz et al. |
| 7,038,435 B2 | 5/2006 | Ortiz et al. |
| 7,050,476 B2 | 5/2006 | Baker |
| 7,058,100 B2 | 6/2006 | Vetrovec et al. |
| 7,065,121 B2 | 6/2006 | Filgas et al. |
| 7,141,940 B2 | 11/2006 | Ortiz |
| 7,170,919 B2 | 1/2007 | Zamel et al. |
| 7,262,584 B2 | 8/2007 | Crawford et al. |
| 7,286,308 B2 | 10/2007 | Kennedy |
| 7,376,160 B2 | 5/2008 | Reeder et al. |
| 7,382,808 B1 | 6/2008 | Efimov |
| 7,440,190 B2 | 10/2008 | Ullman et al. |
| 7,472,741 B2 | 1/2009 | Johnson et al. |
| 7,584,628 B2 | 9/2009 | Harpole |
| 7,626,152 B2 | 12/2009 | King et al. |
| 7,630,423 B2 | 12/2009 | Ushinsky et al. |
| 7,675,952 B2 | 3/2010 | Ushinsky et al. |
| 7,720,126 B2 | 5/2010 | McCarthy |
| 7,751,460 B2 | 7/2010 | Vetrovec et al. |
| 7,792,166 B2 * | 9/2010 | Borschowa ........... H01S 5/0683 323/283 |
| 7,803,451 B2 | 9/2010 | Lee et al. |
| 7,822,091 B2 | 10/2010 | Jackson et al. |
| 7,839,908 B2 | 11/2010 | Yanagisawa et al. |
| 7,952,691 B2 | 5/2011 | Mosier et al. |
| 7,983,312 B2 | 7/2011 | Shkunov et al. |
| 8,023,542 B2 | 9/2011 | Vetrovec |
| 8,068,525 B2 | 11/2011 | Yamamoto et al. |
| 8,080,871 B2 | 12/2011 | Dangelo et al. |
| 8,149,887 B2 | 4/2012 | Yanagisawa et al. |
| 8,170,075 B1 | 5/2012 | Borschowa et al. |
| 8,184,670 B2 | 5/2012 | Crawford et al. |
| 8,203,109 B2 | 6/2012 | Taylor et al. |
| 8,207,711 B2 | 6/2012 | Crawford et al. |
| 8,277,060 B2 | 10/2012 | Cook |
| 8,515,220 B1 | 8/2013 | Khitrov et al. |
| 8,536,503 B2 | 9/2013 | Cook et al. |
| 8,559,477 B2 | 10/2013 | Yanagisawa et al. |
| 8,565,272 B2 | 10/2013 | Shkunov et al. |
| 8,588,267 B1 | 11/2013 | Panak et al. |
| 8,594,144 B1 | 11/2013 | Bagg |
| 8,594,476 B2 | 11/2013 | Shkunov et al. |
| 8,599,898 B2 | 12/2013 | Sukhman et al. |
| 8,606,062 B2 | 12/2013 | Shkunov et al. |
| 8,635,938 B2 | 1/2014 | King et al. |
| 8,643,942 B2 | 2/2014 | Strohkendl et al. |
| 8,654,314 B2 | 2/2014 | King et al. |
| 8,705,918 B2 | 4/2014 | Shkunov et al. |
| 8,729,870 B2 | 5/2014 | Crawford et al. |
| 8,731,013 B2 | 5/2014 | Byren et al. |
| 8,748,857 B2 | 6/2014 | King et al. |
| 8,792,163 B2 | 7/2014 | King et al. |
| 8,977,097 B2 | 3/2015 | Filgas |
| 8,995,487 B1 | 3/2015 | Almonte |
| 2005/0259451 A1 * | 11/2005 | Mbaye .................. H02M 3/337 363/40 |
| 2006/0291512 A1 | 12/2006 | Borschowa |
| 2012/0112547 A1 | 5/2012 | Ghosh |
| 2012/0268026 A1 | 10/2012 | Crawford |

\* cited by examiner

US 9,923,334 B2

LASER DIODE DRIVER WITH VARIABLE INPUT VOLTAGE AND VARIABLE DIODE STRING VOLTAGE

The present application is a Continuation of U.S. patent application Ser. No. 14/960,515, entitled "LASER DIODE DRIVER WITH VARIABLE INPUT VOLTAGE AND VARIABLE DIODE STRING VOLTAGE", filed on Dec. 7, 2015, which is incorporated herein by reference in its entirety.

BACKGROUND

The present disclosure relates generally to high-power laser systems, and more particularly, to diode drivers included in a high-power laser system.

Traditional high-power solid state lasers typically use single and multiple parallel laser amplifier beamlines in a master oscillator/power amplifier (MOPA) configuration. The MOPA configuration includes multiple large and relatively low-gain laser amplifiers. Each laser power amplifier includes a diode driver that supplies a regulated current to single or multiple strings of laser diodes (also known as laser pump arrays) that optically excite the main laser medium such as a laser crystal element.

Conventional diode driver circuits are uniquely designed for each of the gain stages given each required variation in the length of the diode string, i.e., different quantities of laser diodes connected in series. For instance, planar waveguide (PWG) laser systems typically require only one high-gain amplifier in a MOPA architecture. However, applications that span land, sea, air and space domains have a broad range of input line voltages, while also demanding a wide range of output power.

In addition, the laser diodes (i.e., pump arrays) employed in high-power laser systems are typically wired in series with one another, and represent a sizeable portion of the overall system cost. Consequently, a large number of laser diodes can be destroyed if the system suffers a fault condition such as, for example, a short-circuit.

SUMMARY

According to one embodiment, a high-power laser system includes a plurality of cascaded diode drivers, a pump source, and a laser element. The diode drivers are configured to generate a continuous driver signal. The pump source is configured to generate radiated energy in response to the continuous driver signal. The laser element is disposed downstream from the pump source and is configured to generate a laser beam in response to stimulation via the radiated energy. The high-power laser system further includes an electronic controller configured to output at least one driver signal that operates the plurality of diode drivers at a fixed frequency. The at least one driver signal operates a first cascade diode driver among the plurality of diode drivers 90 degrees out of phase with respect to a second cascade diode driver among the plurality of diode drivers.

According to another embodiment, a method of controlling a high-power laser system comprises generating a continuous driver signal via a plurality of cascaded diode drivers connected in a parallel with one another, and operating the plurality of diode drivers at a fixed frequency. The method further includes operating a first cascade diode driver among the plurality of diode drivers 90 degrees out of phase with respect to a second cascade diode driver among the plurality of diode drivers.

Additional features are realized through the techniques of the present invention. Other embodiments and features of the invention are described in detail herein and are considered a part of the claimed invention. For a better understanding of the invention with the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Various embodiments of the present disclosure provide a high-power laser system including a diode driver with a variable input voltage that drives a laser diode array across a wide string-voltage range. According to at least one non-limiting embodiment, the high-power laser system includes a plurality of cascaded power converters. Each power converter includes a buck regulator circuit that drives an independent series resonant DC to DC converter. The buck regulator provides the majority of the control and includes an LC output filter circuit to filter the output current and voltage. According to at least one embodiment, the buck regulator circuit includes a turn-on snubber circuit and a turn-off snubber circuit that eliminate switching losses experienced by traditional buck regulator circuits. In addition, using a plurality of buck regulator circuits operating 90° out of phase with one another provides a feature where the size of the filter inductor is minimized since ripple currents in the LC filters tend to cancel each other thereby allowing the LC filter to be smaller for the same amount of ripple rejection.

The independent series resonant DC to DC converters are connected in parallel with one another and are driven at a fixed frequency. However, each independent series resonant DC to DC converter operates 90° out of phase with one another. Accordingly, the size of the power converter output capacitor can be minimized. In addition, each power converter can be individually optimized with respect to one another. In this manner, the size of the isolated converter output capacitor and converter output filter inductor included in each DC to DC converter can be minimized, while still maximizing the overall power efficiency of the high-power laser system. Therefore, the high-power laser system according to at least one embodiment includes a diode driver capable of receiving a wide input voltage ranging, for example, from approximately 300 volts DC (VDC) to approximately 1000 VDC, continuously outputting power greater than 34 kilowatts (kW) with a power density greater than 40 W/in$^3$ with a power efficiency greater than 95%. In addition, the diode driver according to at least one non-limiting embodiment is capable of generating up to 200 A of continuous current to drive different stack voltages up to 260 VDC, while still providing input to output isolation and less than or equal to 3 µF of output capacitance.

Figure 1:
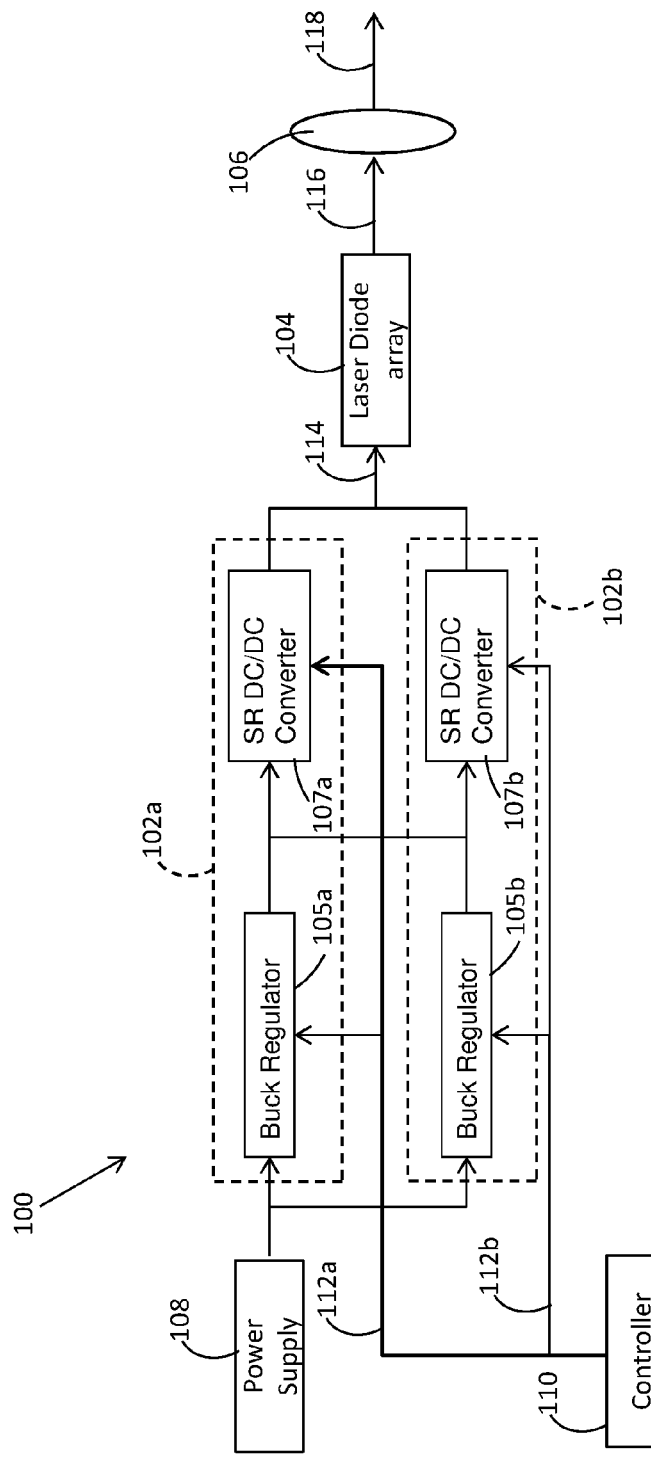
FIG. 1 is a block diagram of a high-power laser system according to a non-limiting embodiment.

Turning now to FIG. 1, a high-power laser system 100 is illustrated according to a non-limiting embodiment. The high-power laser system 100 includes a plurality of cascaded diode drivers 102a-102b, a pump source 104, (i.e., a plurality of diodes connected in series with one another), and a laser element 106. A power supply 108 provides variable input voltage to the diode drivers 102. The input voltage may vary across a wide range from approximately 300 VDC to approximately 1000 VDC, for example. Each diode driver 102a-102b is in signal communication with an electronic diode driver controller 110. In this manner, the diode driver controller 110 can operate an individual diode driver 102a-102b independently from one another. The diode drivers are configured as two-stage drivers. The first stage includes a synchronous buck regulator circuit 105a-105b and the second stage includes an isolated series resonant DC-DC converter 107a-107b. The synchronous buck regulator circuits 105a-105b provide zero current switching such that the voltage or current falls essentially to zero before the switching occurs. In this manner, overlap between voltage and current is eliminated and switching losses are reduced. The series resonant DC-DC converters 107a-107b include a rectifier circuit such as a full-bridge center-tapped rectifier, for example, and a combination of turn-on and turn-off snubber circuits (not shown in FIG. 1) to recycle energy as discussed in greater detail below.

According to a non-limiting embodiment, the diode driver controller 110 is configured to generate one or more driver control signals 112a-112b so as to drive the first and second diode drivers 102a-102b at a fixed frequency, while operating the diode drivers 102a-102b out of phase with one another. For instance, the flow of energy through each diode driver 102a-102b is a rectified sine wave having an amplitude ranging for example, from approximately 0 volts to approximately 250 volts. Normally, this would require a large output capacitor to smooth out the flow of energy to the output. Conventional laser diode drivers typically employ a small output capacitance so that a failure in the pump source 104 (e.g., laser diode array) will not result in a large amount of stored energy being dumped into the laser diode string and resulting in cascading failures. At least one embodiment of the disclosure solves this problem by providing a second fixed frequency diode driver (e.g., 102b) operating in parallel and in quadrature, i.e., 90° out of phase, with a first diode driver (e.g., 102a).

The pump source 104 is in signal communication with the 102a-102b to receive a direct current output drive signal 114. The pump source 104 includes, for example, one or more laser diodes (not shown) configured to emit an electromagnetic radiation having a pre-determined wavelength. The wavelength can range, for example, from approximately 900 nanometers (nm) to 1000 nm. According to a non-limiting embodiment, the pump source 104 includes a plurality of laser diodes connected in series and parallel with one another to form a laser diode array. The laser diode array 104 receives the output drive signal 114, and generates laser light that is received by the laser element 106. The laser element 106 may include various types of active lasing mediums including, but not limited to, a doped yttrium aluminum garnet (YAG) crystal laser element. During use, the pump source 104 emits radiated energy 116 that is directed to the laser element 106. The electromagnetic radiation pumps the core of the laser element to an upper state so as to output a high-powered laser beam 118.

Figure 2:
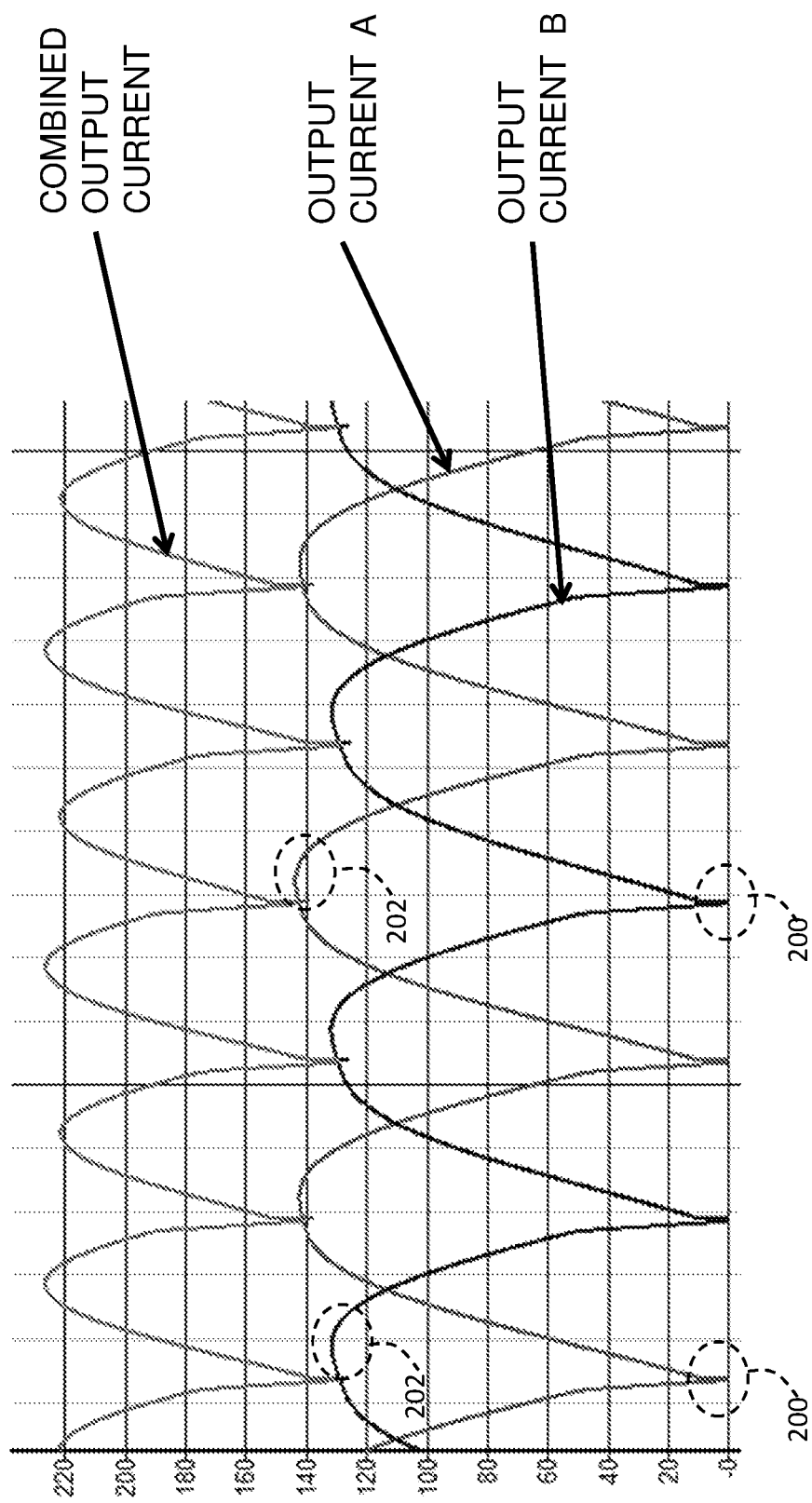
FIG. 2 is a graph illustrating the waveforms of current signals generated by the diode driver for the high-power laser system of FIG. 1.

Referring to FIG. 2, a graph illustrates the waveforms of current signals generated by the high-power diode driver of FIG. 1. The output current from each isolated series resonant DC-DC converter 107a-107b rectifier circuit 404 is shown. For example, the output of the first DC-DC converter 107a is designated as "Output Current A", while the output of the second DC-DC converter 107b is designated as "Output Current B". As discussed above, each DC-DC converter may include a rectifier and, as such, "Output Current A" and "Output Current B" are shown as rectified currents. In particular, the currents are fully rectified in the example shown in FIG. 2. As shown in FIG. 2, the first and second DC-DC converters 107a-107b operate in quadrature (i.e., 90 degrees out of phase). Since first and second DC-DC converters 107a-107b operate in quadrature with respect to one another, the valley 200 of one waveform is paired with the peak 202 of the other waveform. This results in a much more even and continuous flow of current into the output capacitor (designated "Combined Output Current" in FIG. 4). Only a small value of capacitance is required to remove the remaining ripple current, which keeps the value of stored energy to a value low enough that the pump source 104 (e.g., laser diode array) can absorb. In this manner, laser diodes included in the pump source 104 can be protected in the event of a failure such as, for example, a short-circuit.

Figure 3:
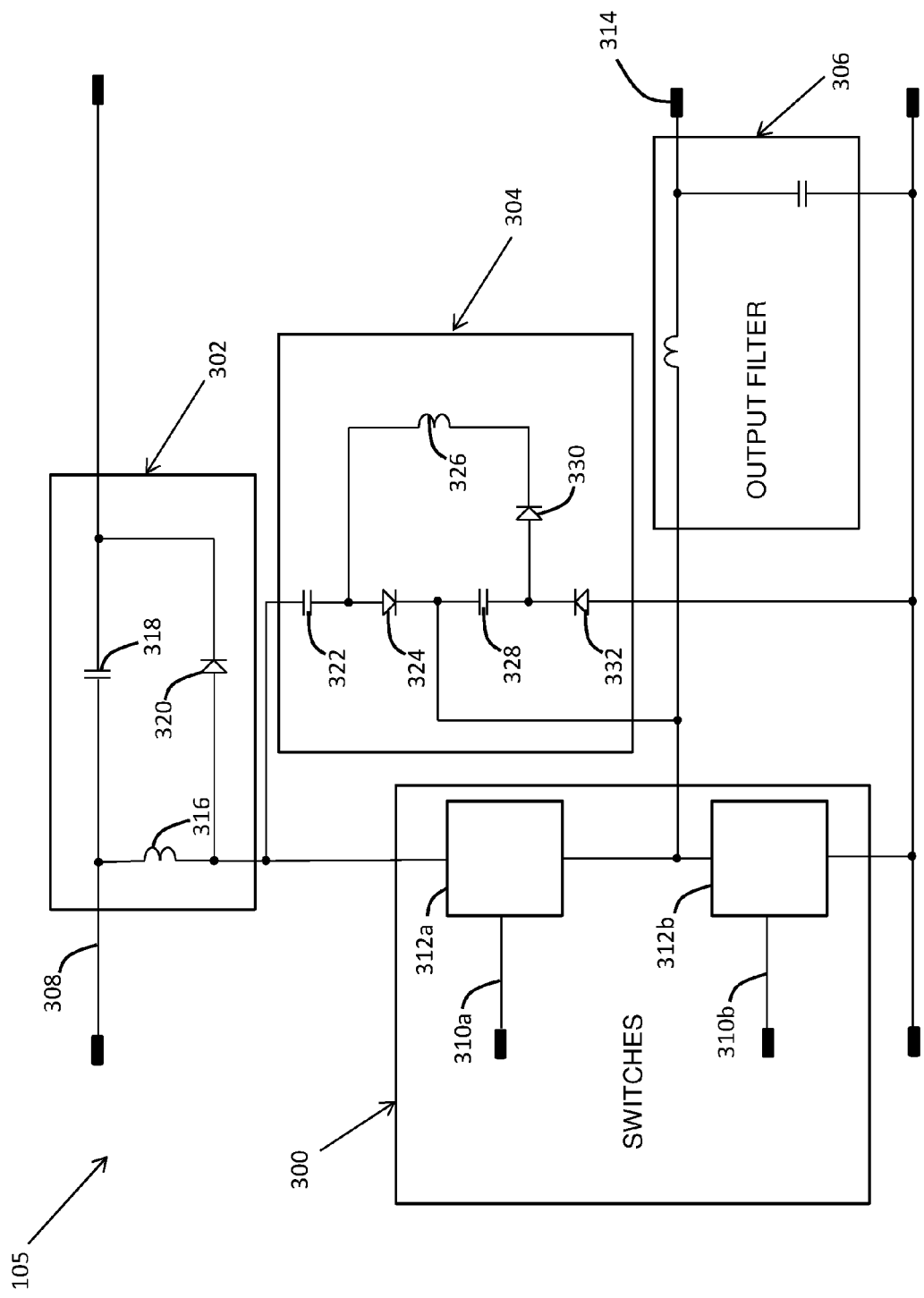
FIG. 3 is a schematic diagram of a buck regulator circuit included in a diode driver for a high-power laser system according to a non-limiting embodiment.

Turning now to FIG. 3, a buck regulator circuit 105 included in the high-power laser system 100 is illustrated in greater detail according to a non-limiting embodiment. The buck regulator circuit 105 includes a switching circuit 300, a turn-on snubber circuit 302, a turn-off snubber circuit 304, and an output filter circuit 306. The switching circuit 300 is in signal communication with the input power supply 108 to receive an input supply voltage, and the controller 110 to receive one or more switch control signals 310a-310b. According to a non-limiting embodiment, the switching unit includes a first semiconductor switch 312a and a second semiconductor switch 312b. The controller 110 generates the switch control signals 310a-310b such that switches 312a-312b are alternately activated, for example, at a fixed frequency, e.g., approximately 100 k Hz. The duty cycle (or duty factor) of the switches 312a-312b can be defined as the ratio at which the time a first switch (e.g., switch 312a) is activated divided by the period of the switching cycle. The duty factor multiplied by the input voltage 308 is approximately equal to the voltage 314 output from the output filter 306, which is configured as an LC filter, for example. Accordingly, the DC-DC converter 107 steps down the input voltage 308 and outputs a regulated output signal 314 (e.g., a regulated voltage or current) from the LC buck filter 306 to a respective series DC-DC converter 107 as described in greater detail below.

The combination of the turn-on snubber 302 and the turn-off snubber 304 provides for an energy recycling unit within the buck regulator circuit. The turn-on snubber 302 is configured as an LCD snubber that includes a first snubber inductor 316, a first snubber capacitor 318, and a first snubber diode 320. The first snubber inductor 316 includes a first end connected to the input voltage 308 and a second end connected to the drain of the first switch 312. The first snubber capacitor 318 includes a first end connected to the input voltage 308 and the first end of the first snubber inductor 316. The second end of the first snubber capacitor 318 is connected to the cathode of the snubber diode 320.

The anode of the first snubber diode 320 is connected to the second end of the first snubber inductor 316 and the drain of the first switch 312a.

The turn-off snubber 304 is in signal communication with both the switching regulator circuit 300 and the turn-on snubber 302, and includes a combination of voltage regulator capacitors and diodes to control the rate of voltage change between the first switch 312a and the second switch 312b when the first switch 312a is switched off. More specifically, the turn-off snubber 304 includes a second snubber capacitor 322, a second snubber diode 324, a second snubber inductor 326, a third snubber capacitor 328, a third snubber diode 330, and a fourth snubber diode 332. The second snubber capacitor 322 includes a first end connected to the second end of the first snubber inductor 316, the anode of the first snubber diode 320 and the drain of the first switch 312a. The second end of the second snubber capacitor 322 is connected to the anode of the second snubber diode 324 and a first end of the second snubber inductor 326.

The cathode of the second snubber diode 324 is connected to a first end of the third snubber capacitor 328 and a common node shared by the source of the first switch 312a and the drain of the second switch 312b. The anode of the third snubber diode 330 is connected to the second end of the third snubber capacitor 328 and the cathode of the fourth snubber diode 332, while the cathode of the third snubber diode 330 is connected to the second end of the second snubber inductor 326.

During operation, the first snubber inductor 316 absorbs the full voltage (e.g., 2000 volts) that otherwise would exist across the first switch 312a, and controls the rise in current in response to a switch activation event (e.g., when switch 312a is switched on). When the current reaches the same level of the current at the output, the voltage across the first snubber inductor 316 becomes essentially zero.

When switching alternates from the first switch 312a to the second switch 312b (e.g., a switch deactivation event when the first switch 312a turns off), current stored in the first snubber inductor 316 and current remaining in the first switch 312a is diverted to the turn-off snubber 304. In this manner, switch loss is substantially reduced by transferring the current diverted into the snubber capacitors 322/328 where the second and third snubber capacitors 322/328 alternate charging and discharging of the their stored energy which recycle the energy so as to generate negligible current in the switch while the voltage is changing.

Figure 4:
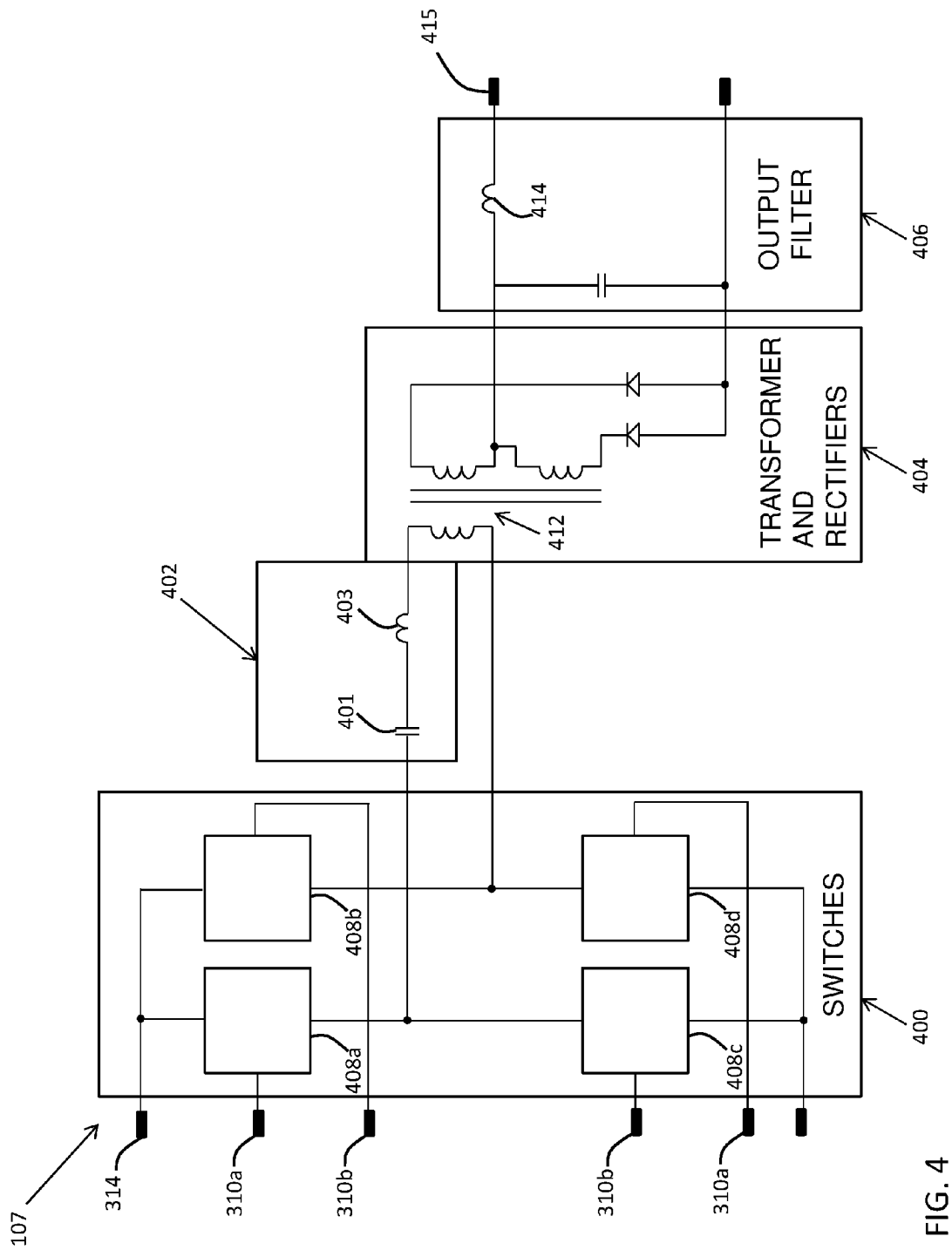
FIG. 4 is a schematic diagram of a series resonant DC to DC converter included in a diode driver for a high-power laser system according to a non-limiting embodiment.

Referring to FIG. 4, a series resonant DC to DC converter 107 included in the high-power laser system 100 is illustrated. According to a non-limiting embodiment, the series resonant DC-DC converter 107 is configured as a fixed frequency series resonant isolation stage. Each series resonant DC to DC converter 107 includes a switching unit 400, a series resonant circuit 402, a rectifier circuit 404, and an output filter 406. The switching unit 400 includes a plurality of switches configured as a full-bridge and operated at a fixed frequency of approximately equal to the series resonant circuit 402 resonant frequency, for example 50 k Hz, so as to achieve resonant frequency. The full-bridge switching unit 400 comprises a first half that includes first half switches 408a-408b and a second half that includes second half switches 408c-408d. The switches 408a-408d are each driven according to drive signals, such as a square wave for example, generated by the controller 110 (not shown in FIG. 4). According to a non-limiting embodiment, the controller 110 generates a first drive signal 410a that drives one first half switch 408a and one second half switch 408d, and a second drive signal 410b that drives the remaining first half switch 408b and the remaining second half switch 408c. However, the first drive signal 410a is 180 degrees out of phase with respect to the second drive signal 410b. Accordingly, switches 408b and 408c are switched off when switches 408a and 408d are switched on, and vice versa. Although a full-bridge switch configuration is described, it should be appreciated that other switching topologies may be implemented, so long as the switching unit is operated at a fixed frequency.

The rectifier circuit 404 is connected to the switching unit 400 via the series resonant circuit 402. According to a non-limiting embodiment, the rectifier circuit 400 is configured as a full-wave center tapped rectifier. It should be appreciated, however, that other types of full-wave rectifier topologies can be implemented including, for example, a full-bridge rectifier. In addition, the various different winding topologies can be implemented without departing from the scope of the invention.

The rectifier circuit 404 includes a transformer 412 having a primary winding connected to the output of the series resonant circuit 402, and a center-tapped pair of secondary windings connected to the output filter 406. The series resonant circuit 403 is configured as an LC resonator 402, i.e., resonant tank circuit 402 including a resonant capacitor 401 connected in series with a resonant inductor 403. The values of the resonant capacitor 401 and resonant inductor 403 are selected so as to match the switching frequency of the switches 408a-408d at switching frequency.

The output filter 406 is configured as an LC filter including an output capacitor (not shown) that maintains the voltage at the input of the transformer filter 406 at approximately a constant value. As a result, the transformer 412 included in the rectifier circuit 404 realizes a square wave. The current through the transformer 412 is approximately a sine wave which is generated by the series resonant circuit 402. In this manner, the output voltage and the current through the inductor 414 is provided to the pumping source 104 so as to drive a laser diode array, to induce the laser element 106 to generate the high-power laser beam 118.

During operation, the switches 408a-408d create a square wave voltage, which is equal in amplitude to the input voltage. The square wave generated by the switching unit 400 is input to the series resonant circuit 402 and ultimately applied to the primary winding of the transformer 412. The switches 408a-408d are operated in pairs. For example, switch 408a and 408d conduct simultaneously, but alternate 180 degrees out of phase with switches 408b and 408c (which also conduct simultaneously). The current waveform through the switches 408a-408d is a half sine wave. Thus, each pair of switches (i.e., 408a/408d and 408b/408c) turn on or turn off at zero current since the switching frequency is equal to the resonant frequency of the series resonant circuit. This mode of operation results in the lowest level of losses in the switch, since only conduction losses are present and switching losses have been substantially eliminated.

The flow of energy through the series resonant circuit 402 is a sine wave, and therefore is not constant. As a result, conventional diode drivers typically require a large output capacitor to smooth out the flow of energy to the output. However, at least one embodiment of the disclosure provides a high-power laser system 100 that includes a plurality of cascaded diode drivers. In this manner, a first fixed frequency series resonant converter operates in parallel and in quadrature, i.e., 90° out of phase, with a second fixed frequency series resonant converter. Accordingly, only a small value of capacitance is required to remove the remaining ripple current, which keeps the value of stored energy to a value low enough to be absorbed by the pump source (i.e., laser diode arrays) without damage in the event of a failure.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

Various hardware controllers can be implemented to execute the operations of the circuits and methods described herein. The hardware controller can include an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. One or more controllers are also configured to execute various algorithms, transforms, and/or logical processes to generate one or more signals of controlling a component or system.

What is claimed is:

1. A buck regulator circuit configured to convert an input voltage into a regulated output signal drive that drives at least one diode driver included in a high-power laser system, the buck regulator circuit comprising:
    a switching unit including a plurality of switches in signal communication with an input power supply and configured to convert the input voltage having a first voltage into the regulated output signal supplied to each isolated resonant series DC to DC converter; and
    an energy recycling unit configured to absorb energy from the switching unit so as to reduce switching losses of the switching unit while driving at least one diode driver among a plurality of diode drivers of the high-power laser system,
    an electronic controller that is configured to output at least one driver signal that operates the plurality of diode drivers at a fixed frequency,
    wherein the at least one driver signal operates a first cascade diode driver among the plurality of diode drivers 90 degrees out of phase with respect to a second cascade diode driver among the plurality of diode drivers.

2. The buck regulator circuit of claim 1, wherein the energy recycling unit is configured to absorb energy from the switching unit so as to reduce switching losses of the switching unit.

3. The buck regulator circuit of claim 2, wherein the energy recycling unit further comprises:
    a turn-on snubber circuit configured to absorb a full voltage applied to the switching unit so as to control the rise in current through the switching unit in response to a switch activation event; and
    a turn-off snubber circuit configured to receive current from the switching unit and the turn-on snubber circuit in response to a switch de-activation event.

4. The buck regulator circuit of claim 3, wherein the controller generates regulator switch control signals that activate the regulator switches in the switching unit in an alternating manner at a fixed frequency.

5. The buck regulator circuit of claim 3, wherein the switching unit generates a square wave voltage that is approximately equal in amplitude to the input voltage based on the regulated output signal.

6. The buck regulator circuit of claim 5, further comprising a rectifier circuit that is connected to the switching unit via the series resonant DC to DC converter, and converts the square wave into a rectified square wave.

7. The buck regulator circuit of claim 6, wherein a resonant tank circuit is connected between the switching unit and the rectifier circuit so as to operate the switching unit at a resonance frequency defined by the resonant tank circuit.

8. The buck regulator circuit of claim 7, wherein the resonant tank circuit is an LC resonant tank circuit including a resonating capacitor connected in series with a resonating inductor to define the resonance frequency.

9. The buck regulator circuit of claim 7, wherein the switching unit includes a plurality of semiconductor switches connected to define a full-bridge switching unit.

10. The buck regulator circuit of claim 7, wherein the rectifier circuit includes a plurality of diodes connected to form a full-wave rectifier.

11. A buck regulator circuit configured to convert an input voltage into a regulated output signal drive that drives at least one diode driver included in a high-power laser system, the buck regulator circuit comprising:
    a switching unit including a plurality of switches in signal communication with an input power supply and configured to convert the input voltage having a first voltage into the regulated output signal supplied to a plurality of isolated resonant series DC to DC converters; and
    an energy recycling unit configured to absorb energy from the switching unit so as to reduce switching losses of the switching unit while driving the at least one diode driver among a plurality of diode drivers of the high-power laser system;
    a rectifier circuit that is connected to the switching unit via a series resonant DC to DC converter among the plurality of isolated resonant series DC to DC converters, and converts a square wave into a rectified square wave; and
    a resonant tank circuit connected between the switching unit and the rectifier circuit so as to operate the switching unit at a resonance frequency defined by the resonant tank circuit.

* * * * *